US012675974B2

(12) United States Patent
Meutzner et al.

(10) Patent No.: US 12,675,974 B2
(45) Date of Patent: Jul. 7, 2026

(54) TECHNIQUES FOR AUTOMATED COMPONENT CLASSIFICATION

(71) Applicant: VisualAIM LLC, Pasadena, TX (US)

(72) Inventors: Brendan Karl Meutzner, Pasadena, TX (US); Dayron Cruz Ingo, Pasadena, TX (US)

(73) Assignee: VisualAIM LLC, Pasadena, CA (US)

( * ) Notice: Subject to any disclaimer, the term of this patent is extended or adjusted under 35 U.S.C. 154(b) by 319 days.

(21) Appl. No.: 18/555,239

(22) PCT Filed: Apr. 12, 2022

(86) PCT No.: PCT/US2022/024402
§ 371 (c)(1),
(2) Date: Oct. 12, 2023

(87) PCT Pub. No.: WO2022/221268
PCT Pub. Date: Oct. 20, 2022

(65) Prior Publication Data
US 2024/0193918 A1    Jun. 13, 2024

Related U.S. Application Data

(60) Provisional application No. 63/173,839, filed on Apr. 12, 2021.

(51) Int. Cl.
*G06V 10/764* (2022.01)
*G06F 30/13* (2020.01)
(Continued)

(52) U.S. Cl.
CPC ............ *G06V 10/764* (2022.01); *G06F 30/13* (2020.01); *G06T 19/20* (2013.01); *G06V 10/255* (2022.01); *G06V 10/774* (2022.01)

(58) Field of Classification Search
CPC ... A01M 21/043; G06V 10/82; G06V 20/188; G06V 10/22; G06V 10/774; G06V 10/776; G06V 10/764
See application file for complete search history.

(56) References Cited

U.S. PATENT DOCUMENTS 10,937,211 B2 * 3/2021 Bergin ................... G06F 30/13
12,169,888 B2 * 12/2024 Hu ......................... G06T 11/206
(Continued)

FOREIGN PATENT DOCUMENTS

EP          4116740 A1 * 1/2023 ............. G06V 20/64
WO    WO-2020247772 A1 * 12/2020 ............... G06N 3/09

OTHER PUBLICATIONS

Garcia et al., 2019, "New trends on digitisation of complex engineering drawings" (pp. 1695-1712) (Year: 2019).*
(Continued)

*Primary Examiner* — Manav Seth
(74) *Attorney, Agent, or Firm* — Blank Rome LLP

(57) ABSTRACT

Generating intelligent drawings includes obtaining a current set of design drawings for a physical plant comprising a plurality of components, generating rasterized drawings from the current set of design drawings, and applying an object detection model to the rasterized drawings to extract a set of shapes corresponding to components in the drawings. A trained library is applied to the extracted shapes to obtain a classification of components in the drawings, and the classification is propagated to instances of the components in the current set of drawings.

19 Claims, 10 Drawing Sheets

(51) Int. Cl.
   G06T 19/20       (2011.01)
   G06V 10/20       (2022.01)
   G06V 10/774     (2022.01)

(56)             References Cited

U.S. PATENT DOCUMENTS

2018/0150058 A1     5/2018   Shapiro
2019/0303759 A1*   10/2019   Farabet ................... G06F 9/455
2023/0054197 A1*    2/2023   Richards ............... G06F 18/214

OTHER PUBLICATIONS

Fu et al., 2011, "From engineering diagrams to engineering models: Visual recognition and applications" (pp. 278-292) (Year: 2011).*
Elyan et al., 2020, "Deep learning for symbols detection and classification in engineering drawings" (pp. 91-102) (Year: 2020).*
Elyan et al., 2018, "Symbols Classification in Engineering Drawings" (pp. 1-8) (Year: 2018).*
International Search Report and Written Opinion issued on Aug. 12, 2022 in corresponding PCT Application No. PCT/US2022/024402, 13 pages.

* cited by examiner

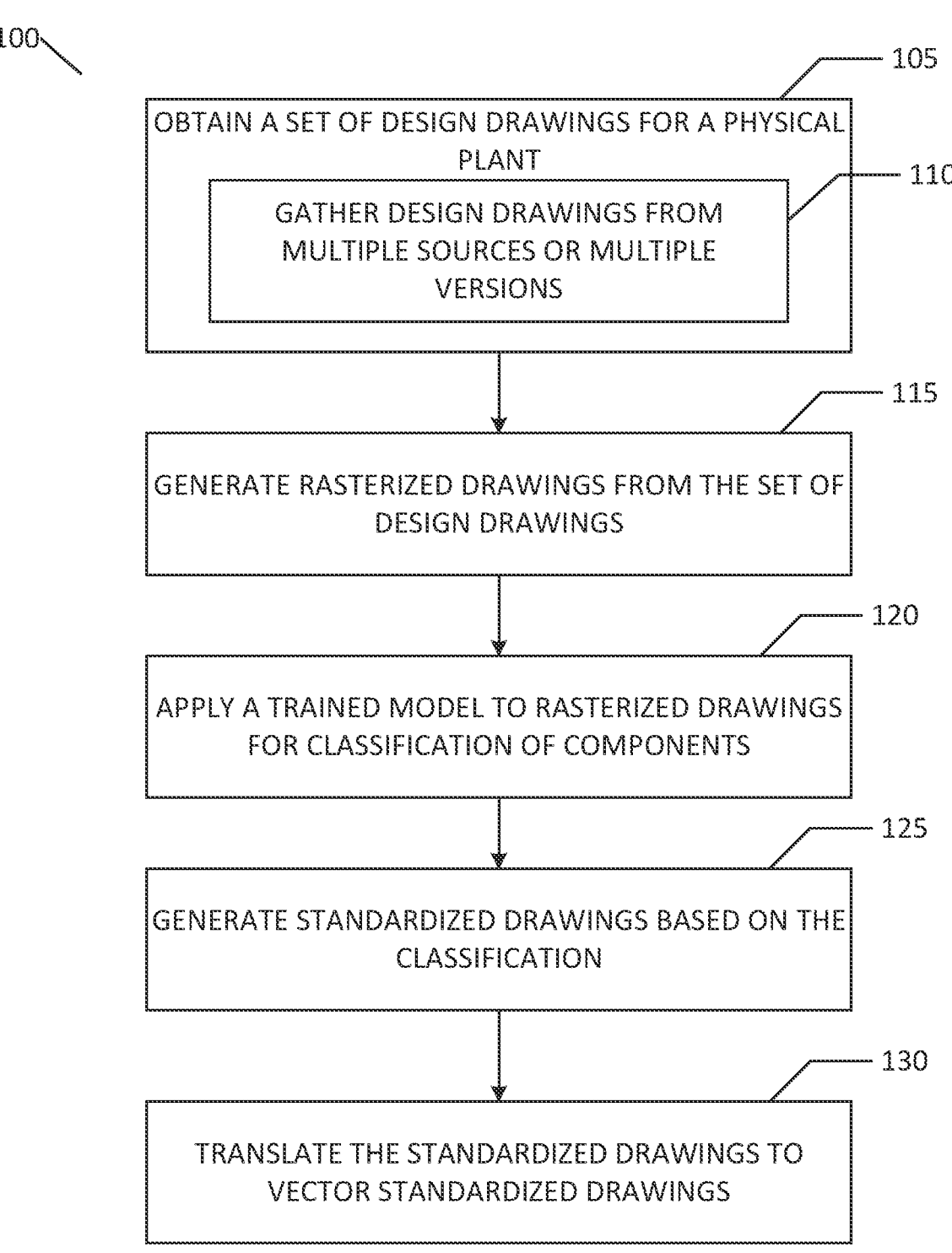

100

105

OBTAIN A SET OF DESIGN DRAWINGS FOR A PHYSICAL PLANT

110

GATHER DESIGN DRAWINGS FROM MULTIPLE SOURCES OR MULTIPLE VERSIONS

115

GENERATE RASTERIZED DRAWINGS FROM THE SET OF DESIGN DRAWINGS

120

APPLY A TRAINED MODEL TO RASTERIZED DRAWINGS FOR CLASSIFICATION OF COMPONENTS

125

GENERATE STANDARDIZED DRAWINGS BASED ON THE CLASSIFICATION

130

TRANSLATE THE STANDARDIZED DRAWINGS TO VECTOR STANDARDIZED DRAWINGS

*FIG. 1*

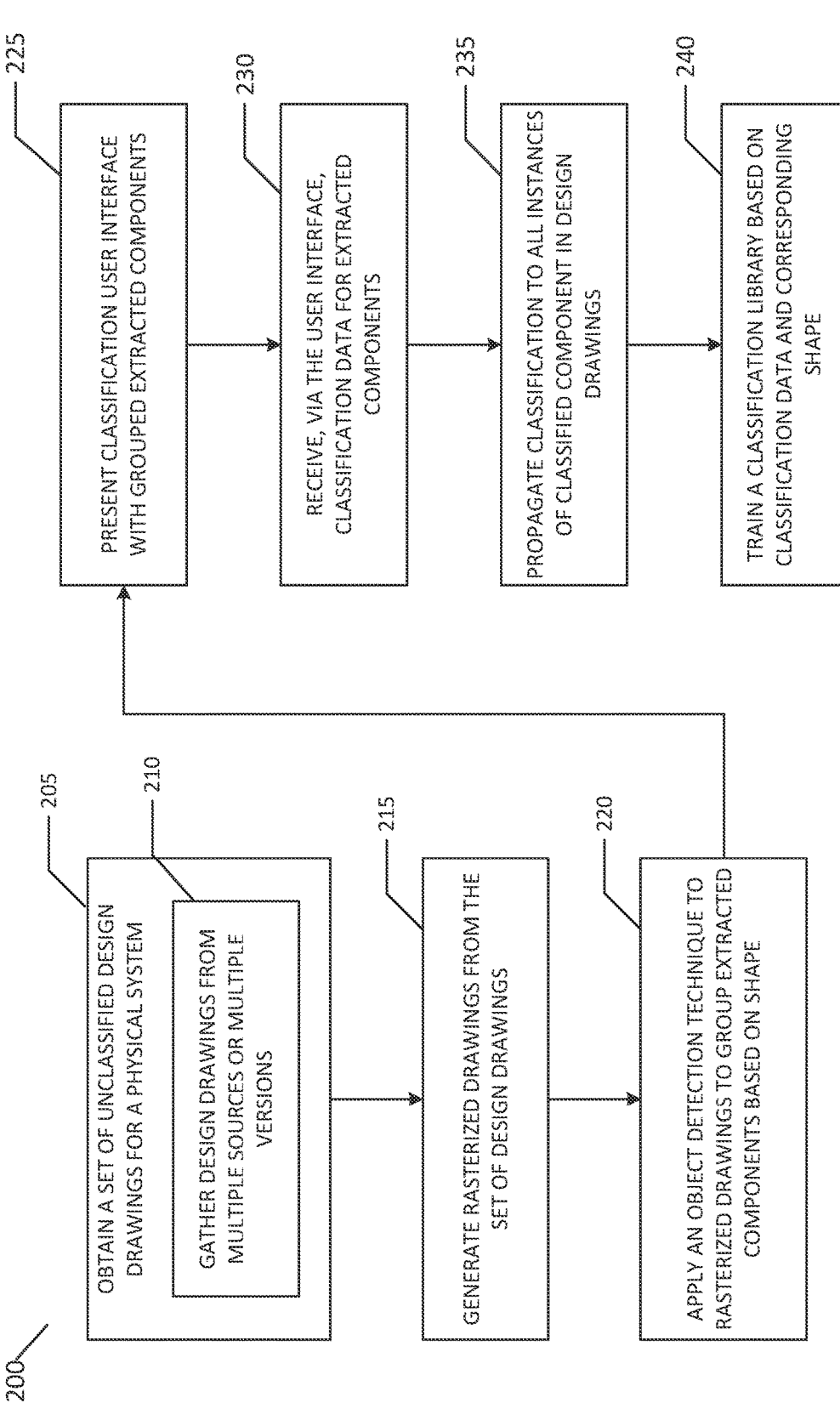

225 — PRESENT CLASSIFICATION USER INTERFACE WITH GROUPED EXTRACTED COMPONENTS

230 — RECEIVE, VIA THE USER INTERFACE, CLASSIFICATION DATA FOR EXTRACTED COMPONENTS

235 — PROPAGATE CLASSIFICATION TO ALL INSTANCES OF CLASSIFIED COMPONENT IN DESIGN DRAWINGS

240 — TRAIN A CLASSIFICATION LIBRARY BASED ON CLASSIFICATION DATA AND CORRESPONDING SHAPE

205 — OBTAIN A SET OF UNCLASSIFIED DESIGN DRAWINGS FOR A PHYSICAL SYSTEM

210 — GATHER DESIGN DRAWINGS FROM MULTIPLE SOURCES OR MULTIPLE VERSIONS

215 — GENERATE RASTERIZED DRAWINGS FROM THE SET OF DESIGN DRAWINGS

220 — APPLY AN OBJECT DETECTION TECHNIQUE TO RASTERIZED DRAWINGS TO GROUP EXTRACTED COMPONENTS BASED ON SHAPE

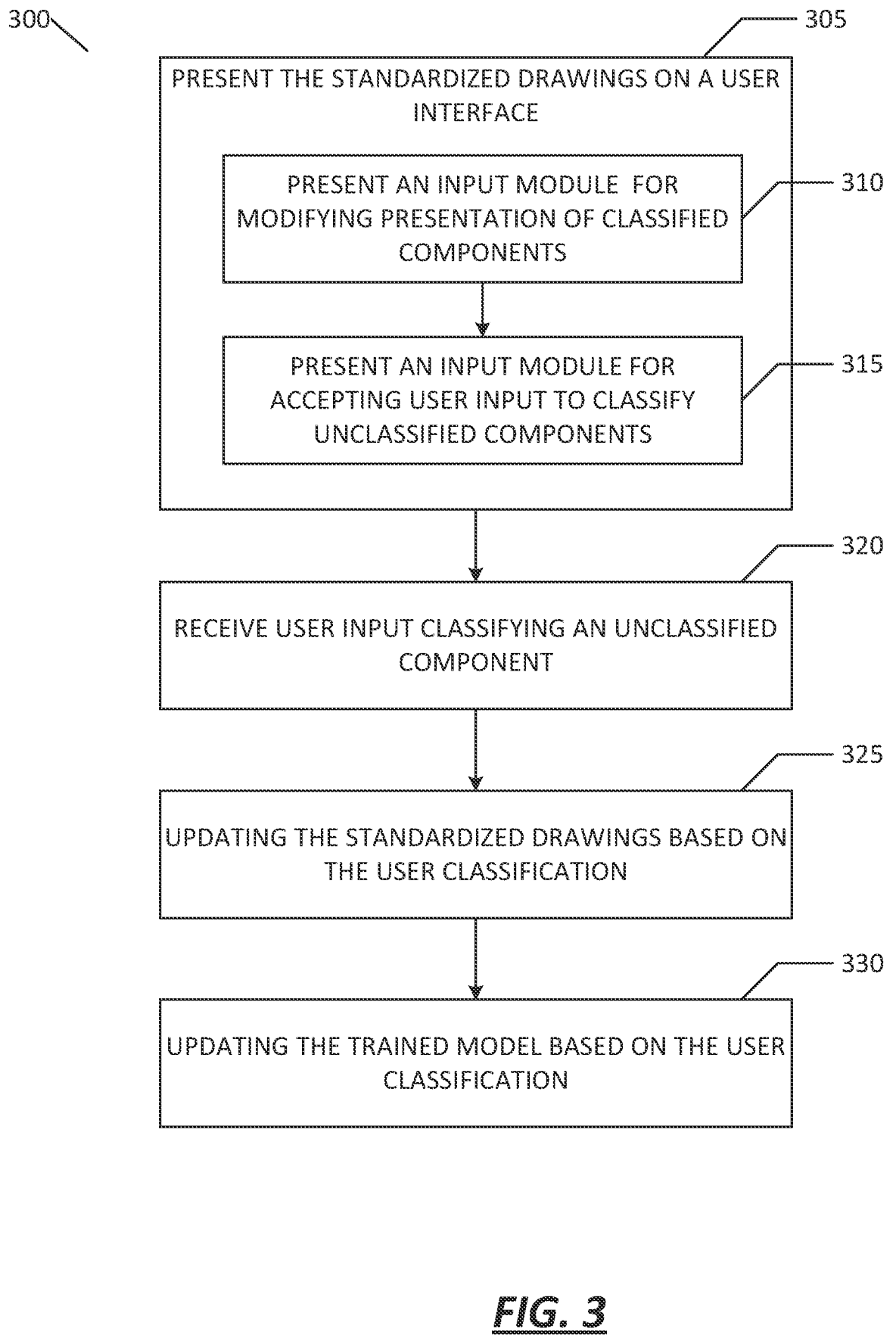

PRESENT THE STANDARDIZED DRAWINGS ON A USER INTERFACE

PRESENT AN INPUT MODULE FOR MODIFYING PRESENTATION OF CLASSIFIED COMPONENTS — 310

PRESENT AN INPUT MODULE FOR ACCEPTING USER INPUT TO CLASSIFY UNCLASSIFIED COMPONENTS — 315

RECEIVE USER INPUT CLASSIFYING AN UNCLASSIFIED COMPONENT — 320

UPDATING THE STANDARDIZED DRAWINGS BASED ON THE USER CLASSIFICATION — 325

UPDATING THE TRAINED MODEL BASED ON THE USER CLASSIFICATION — 330

*FIG. 3*

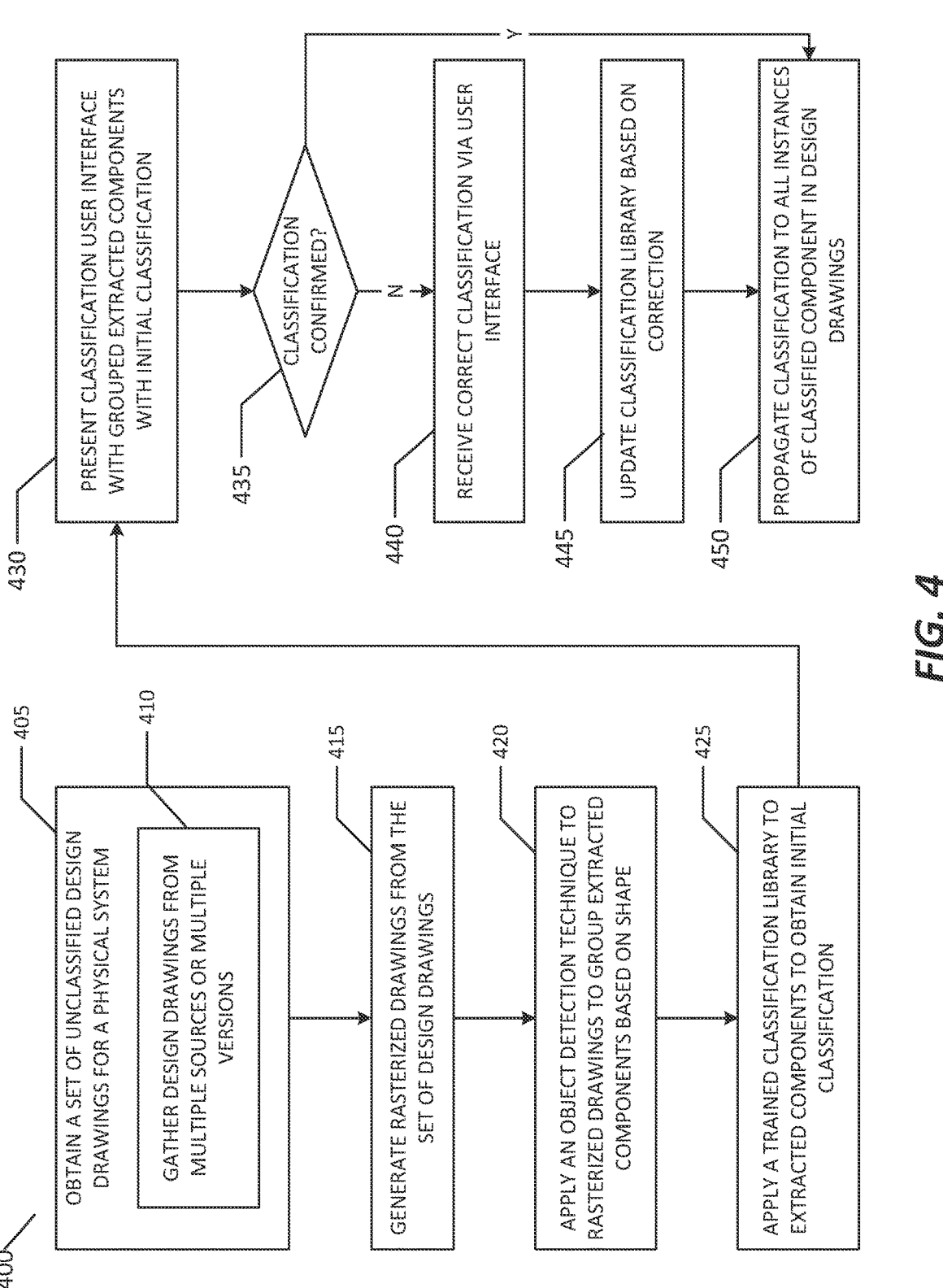

400

405 — OBTAIN A SET OF UNCLASSIFIED DESIGN DRAWINGS FOR A PHYSICAL SYSTEM

410 — GATHER DESIGN DRAWINGS FROM MULTIPLE SOURCES OR MULTIPLE VERSIONS

415 — GENERATE RASTERIZED DRAWINGS FROM THE SET OF DESIGN DRAWINGS

420 — APPLY AN OBJECT DETECTION TECHNIQUE TO RASTERIZED DRAWINGS TO GROUP EXTRACTED COMPONENTS BASED ON SHAPE

425 — APPLY A TRAINED CLASSIFICATION LIBRARY TO EXTRACTED COMPONENTS TO OBTAIN INITIAL CLASSIFICATION

430 — PRESENT CLASSIFICATION USER INTERFACE WITH GROUPED EXTRACTED COMPONENTS WITH INITIAL CLASSIFICATION

435 — CLASSIFICATION CONFIRMED?

440 — RECEIVE CORRECT CLASSIFICATION VIA USER INTERFACE

445 — UPDATE CLASSIFICATION LIBRARY BASED ON CORRECTION

450 — PROPAGATE CLASSIFICATION TO ALL INSTANCES OF CLASSIFIED COMPONENT IN DESIGN DRAWINGS

OBTAIN STANDARDIZED DRAWINGS FOR A PLANT

710

OBTAIN A 3D MODEL OF THE PLANT

715

SCAN A PHYSICAL PLANT IN A PHYSICAL ENVIRONMENT

720

GENERATE A POINT CLOUD BASED ON THE SCAN

725

MAP COMPONENTS OF THE STANDARDIZED DRAWINGS TO THE 3D MODEL

730

ENHANCE THE 3D MODEL BASED ON THE CLASSIFIED COMPONENTS FROM THE STANDARDIZED DRAWINGS

TECHNIQUES FOR AUTOMATED COMPONENT CLASSIFICATION

BACKGROUND

Plants are built from design drawings that can range widely over time. For example, a single plant may be designed from multiple versions of drawings or drawings from different providers. In addition, those drawings may not be standardized. For example, the symbology used by design firms may differ, even among versions of the drawings.

The lack of standardization causes issues when trying to utilize the drawings. For example, it may be important to know a number of particular components used within the plant. However, the symbols used for a particular component may vary, for example, if various versions of drawings were used to build a plant or if the drawings used to build the plant came from multiple sources. Accordingly, there is a need for standardization of drawings.

BRIEF DESCRIPTION OF THE DRAWINGS

For a detailed description of various examples, reference will now be made to the accompanying drawings in which:

FIG. 1 shows a flowchart of a method for generating standardized drawings, according to one or more embodiments, FIG. 2 shows a flowchart of a technique for training a classification library, according to one or more embodiments, FIG. 3 shows a flowchart of a method for receiving classification data through a user interface, according to one or more embodiments, FIG. 4 shows a flowchart of a technique for applying component classification throughout design drawings.

DETAILED DESCRIPTION

Figure 5:
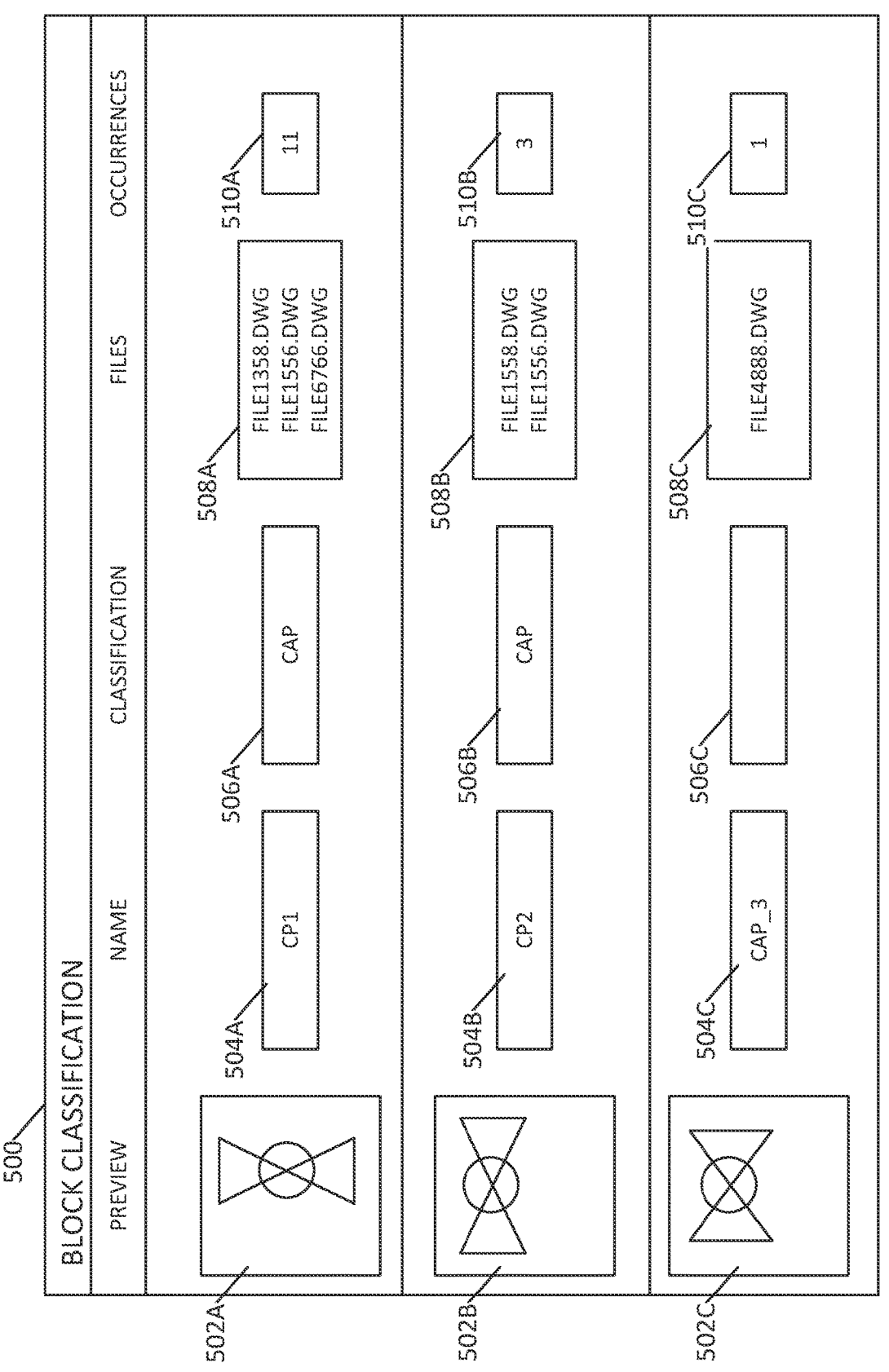
FIG. 5 depicts an example user interface for obtaining component classification, according to one or more embodiments.

Technical drawings are used to design and build plants. These drawings typically include numerous symbols and metrics which describe the design and makeup of a plant. However, these drawings often lack consistency, making it difficult for plant personnel to streamline operations.

Drawing sets may be obtained or provided, for example, in the form of computer-aided design (CAD) drawings. The CAD drawings may contain sets of drawings including different files, different pages, and the like. Within the drawings may be numerous symbols representative of components. In some embodiments, the CAD drawings may have labels for the symbols, but the labels may not be accurate, and/or a same component may be labeled with multiple labels across drawings or even within a single drawing. As such, for purposes of the description herein, drawings may be considered unclassified even if the components are associated with some label within the drawing.

In some embodiments, to obtain a classification for the components, the representations of components may be extracted from the drawings. The CAD drawings may be transformed from vector drawings to rasterized drawings from which an object recognition technique can be applied. The object recognition technique may include applying an object recognition model to identify sets of components which may be of a same type. The sets of components are then classified using a trained library that has been trained to predict a component classification for a particular shape. When the classification is confirmed, the classification can be propagated to all instances of the component corresponding to the shape or group of shapes throughout the drawings.

In the following description, numerous specific details are set forth to provide a thorough understanding of the various techniques. As part of this description, some of the drawings represent structures and devices in block diagram form. In this context, it should be understood that references to numbered drawing elements without associated identifiers (e.g., 100) refer to all instances of the drawing element with identifiers (e.g., 100a and 100b). Further, as part of this description, some of this disclosure's drawings may be provided in the form of a flow diagram. The boxes in any particular flow diagram may be presented in a particular order. However, it should be understood that the particular flow of any flow diagram is used only to exemplify one embodiment. In other embodiments, any of the various components depicted in the flow diagram may be omitted, or the components may be performed in a different order or even concurrently. In addition, other embodiments may include additional steps not depicted as part of the flow diagram. Further, the various steps may be described as being performed by particular modules or components. It should be understood that the language used in this disclosure has been principally selected for readability and instructional purposes and may not have been selected to delineate or circumscribe the disclosed subject matter. As such, the various processes may be performed by alternate components than the ones described.

Reference in this disclosure to "one embodiment" or to "an embodiment" means that a particular feature, structure, or characteristic described in connection with the embodiment is included in at least one embodiment, and multiple references to "one embodiment" or to "an embodiment" should not be understood as necessarily all referring to the same embodiment or to different embodiments, FIG. 1 shows a flowchart of a method for generating standardized drawings, according to one or more embodiments. It should be understood that the particular flow of the flow diagram is used only to exemplify one embodiment. In other embodiments, any of the various components depicted in the flow diagram may be omitted, or the components may be performed in a different order or even concurrently. In addition, other embodiments may include additional steps not depicted as part of the flow diagram. Further, the various steps may be described as being performed by particular modules or components.

The flowchart 100 begins at block 105 where a set of design drawings are obtained for a physical system, such as a particular physical plant or other structure. In some embodiments, as shown at block 110, the design drawings may be compiled from multiple sources or multiple versions. As such, the design drawings may contain inconsistent symbols or other indications for various components of the plant. Moreover, inconsistent symbols may be present within a single drawing depending on user technique when generating the drawings. Inconsistencies may refer to, for example, a CAD-provided label of the component, a shape of the component, or the like.

The flowchart continues at block 115 where a computing system generates rasterized drawings from the set of design drawings. For example, if the design drawings are in a physical format, a digital scan may be used to obtain a rasterized version of drawings. Alternatively, digital drawings may be translated from a vector format into a rasterized format or the like.

At block 120, a trained model is applied to the rasterized drawings for classification of components in the drawings. The model may be a machine learning model which is configured to read in a geometric shape from the rasterized drawings to provide a classification. The model may be trained, for example, to use a particular geometric representation of a component for classification, or it may be trained based on additional information, such as areas of the drawing surrounding a component, or full drawings, such that predictions may be made based on a global context of the component. Alternatively, the method may include an object detection process to identify potential components in the drawing for classification, and the model may be trained to determine a classification based on the individual rasterized drawing component.

The flowchart continues at block 125 where the system generates standardized drawings based on the classification. In some embodiments, the components detected and classified in the design drawings can be mapped to portions in the rasterized drawings. In particular, a detected component in the rasterized drawings that results in classification may be stored in a data structure with the approximate position and boundary of the component placement in the drawings. The data structure may be populated with additional detected components in the drawings.

The flowchart concludes at block 130 where the system translates the standardized drawings to a vector format to obtain vector standardized drawings, according to some embodiments, According to one or more embodiments, an existing vector version of the drawings may be obtained and enhanced based on the classification. For example, the drawings may contain mathematical definitions of the detected components from the raster. The representations of the detected components may be removed and replaced with a standardized definition for the detected components. Alternatively, an existing vector version of the drawings may not be available. A new vector drawing may be generated using the location information from the classification information, such as the position/boundary definitions to create the vector content. The standardized drawings may be provided in vector form for better usability by plant personnel. For example, in some embodiments, the standardized drawings may be provided in the form of CAD drawings.

FIG. 2 shows a flowchart of a technique for training a classification library, according to one or more embodiments. It should be understood that the particular flow of the flow diagram is used only to exemplify one embodiment. In other embodiments, any of the various components depicted in the flow diagram may be omitted, or the components may be performed in a different order or even concurrently. In addition, other embodiments may include additional steps not depicted as part of the flow diagram. Further, the various steps may be described as being performed by particular modules or components.

The flowchart 200 begins at block 205 where a computer system obtains a set of unclassified design drawings for a physical system or structure, such as a plant. The design drawings may be obtained in the form of CAD drawings and may be in a vector format, physical drawings, or the like. Moreover, at 210, the drawings for a particular system or structure may be gathered from multiple sources or multiple versions.

The flowchart 200 continues at block 215 where the computing system generates rasterized drawings from the set of design drawings. For example, if the design drawings are in a physical format, a digital scan may be used to obtain a rasterized version of drawings. Alternatively, digital drawings may be translated from a vector format into a rasterized format or the like.

At block 220, an object detection technique is performed on the rasterized drawings to extract components based on shape. For example, an object detection technique may identify the components as symbols within the rasterized version of the drawings. The object detection technique may use feature detection on the extracted shapes to group the shapes of the components to identify candidate groupings of shapes.

The flowchart 200 continues at block 225 where the computer system presents a classification user interface on a display device. The classification user interface may provide a visual example of each of the groupings of shapes and may include other data related to the shapes. For example, the interface may identify sources for the shapes, a number of instances the shape appears in the drawings, a label identified for one or more of the shapes, and the like. The classification user interface may provide a user input component from which a user may provide a classification for a set of shapes. The user input component may include, for example, a pull-down menu of candidate classifications, a text box, or the like. The classification data is received at block 230).

The flowchart continues at block 235 where the classification is propagated to all instances of classified components in the design drawings. For example, the component associated with each classified shape may be classified based on the received classification. In some embodiments, the classification may be stored in a data structure associated with the drawings or may be applied to the drawings prior to translating the vector drawings back to a vector version of the drawings. In some embodiments, the components detected and classified in the design drawings can be mapped to portions in the rasterized drawings. In particular, a detected component in the rasterized drawings that results in classification may be stored in a data structure with the approximate position and boundary of the component placement in the drawings. The data structure may be populated with additional detected components in the drawings.

The flowchart 200 concludes at block 240 where a classification library is trained based on the classification data received through the user interface and the corresponding shape. For example, the classified shapes can be used as training data to train a model for predicting a classification for a given shape. In some embodiments, the trained library may be a neural network or other machine learning model trained on the classification and the shape to predict a classification for a given shape. The library may be associated with a data store of previously classified components and/or may be trained based on feature detection techniques for the classified shapes.

Techniques that utilize machine learning models often have to be refined over time and may provide incomplete results. Accordingly. FIG. 3 shows a flowchart of a method for utilizing a user interface to improve a machine learning model for component classification, according to one or more embodiments. It should be understood that the particular flow of the flow diagram is used only to exemplify one embodiment. In other embodiments, any of the various components depicted in the flow diagram may be omitted, or the components may be performed in a different order or even concurrently. In addition, other embodiments may include additional steps not depicted as part of the flow diagram. Further, the various steps may be described as being performed by particular modules or components.

The flowchart 300 begins at block 305 where the system presents the standardized drawing on a user interface. The user interface may be presented, for example, on a display or monitor of a computing device. The user interface may include a presentation of the standardized drawings as well as toolbars and other modules by which a user may interact with the drawings. According to one or more embodiments, as shown at 310, an input module for modifying presentation of classified components may be presented. The input module may be a button, control, or other component which, when selected, allows a user to modify presentation of the design drawings to modify presentation of the classified components. For example, in some embodiments, selection of the component may cause the classified components to be removed from the drawings so that a user can quickly see which components were not yet classified.

Additionally, or alternatively, at block 315, the user interface may include an input module for accepting user input to classify unclassified components. For example, the user interface may allow a user to select a portion of the drawing identifiable as having an unclassified component and apply a classification to it. In some embodiments, the classification may be entered by a user or selected from a list, such as a component library which includes standardized components found in the drawings. Additionally, the components in the component library may be associated with standardized visual representations which may replace the unclassified component when classified.

The flowchart 300 continues at block 320 where user input is received to classify an unclassified component. For example, a user may select a geometric shape in the drawings that is identifiable as an unclassified component. The classification may be determined from the user input. Then, at block 325, the standardized drawings may be updated based on the user-defined classification. That is, the visual representation of the component may be updated based on the classification.

The flowchart concludes at block 330, where the trained model is updated based on the classification. For example, the trained model may be refined based on the classification, such as by treating the selected geometric shape in the drawings and the user-defined classification as training data to re-train the model. As another example, the trained model may be refined with preprocessing or post processing filters to identify and characterize the particular geometric shape or the like.

In some embodiments, once the trained library has been trained, then the computer system can provide a predicted classification for components in additional sets of drawings. FIG. 4 shows a flowchart of a technique for applying component classification throughout design drawings. It should be understood that the particular flow of the flow diagram is used only to exemplify one embodiment. In other embodiments, any of the various components depicted in the flow diagram may be omitted, or the components may be performed in a different order or even concurrently. In addition, other embodiments may include additional steps not depicted as part of the flow diagram. Further, the various steps may be described as being performed by particular modules or components.

The flowchart 400 begins at block 405 where a computer system obtains a set of unclassified design drawings for a physical system or structure, such as a plant. The design drawings may be obtained in the form of CAD drawings and may be in a vector format, physical drawings, or the like. Moreover, at 410, the drawings for a particular system or structure may be gathered from multiple sources or multiple versions.

The flowchart 400 continues at block 415 where the computing system generates rasterized drawings from the set of design drawings. For example, if the design drawings are in a physical format, a digital scan may be used to obtain a rasterized version of drawings. Alternatively, digital drawings may be translated from a vector format into a rasterized format or the like.

At block 420, an object detection technique is performed on the rasterized drawings to extract components based on shape. For example, an object detection technique may identify the components as symbols within the rasterized version of the drawings. The object detection technique may use feature detection on the extracted shapes to group the shapes of the components to identify candidate groupings of shapes.

The flowchart 400 continues at block 425 where the trained classification library is applied to the extracted components to obtain an initial classification, where possible, to the shapes corresponding to the extracted objects. As described above, the trained classification library may be a machine learning model which is configured to predict a classification based on a given shape. However, it may be possible that the trained library is unable to provide a prediction for a particular shape. Although the object detection technique and the trained classification model are described separately, it should be understood that in some embodiments, the object detection technique and the trained classification model may be concurrently trained such that a single model may identify a shape and provide a predicted classification from unclassified drawings. In some embodiments, the model is trained based on user-provided classifications applied to extracted shapes, as described above with respect to FIG. 2.

The flowchart continues at block 430, where a classification user interface is presented with grouped extracted components with the predicted initial classifications. In some embodiments, a single shape may be presented for the grouped components along with the predicted classification for the group as provided by the trained classification library. In some embodiments, if the trained classification library is unable to predict a classification for the shape, the classification user interface may prompt a user to provide a classification.

In the instance where a prediction is provided, a user may confirm whether the prediction is correct. The flowchart continues at block 435, and if the predicted classification is not confirmed or if the user is prompted to provide a classification, then the flowchart 400 continues at block 440) and the computer system receives the correct classification via the user interface. For example, a user may enter the classification in a text box, select a classification from a drop-down menu, or the like.

The flowchart 400 continues at block 445 where the trained classification library is updated based on the classification data received through the user interface and the corresponding shape. For example, the classified shapes can be used as additional training data to re-train a model for predicting a classification for a given shape, or to otherwise refine the trained model. In some embodiments, the trained library may be a neural network or other machine learning model trained on the classification and the shape to predict a classification for a given shape. The library may be associated with a data store of previously classified components and/or may be trained based on feature detection techniques for the classified shapes. As such, the shape may be added to the data store.

The flowchart concludes at block 450 after the classification library is updated and, returning to block 435, if the user confirms the predicted classification. The computer system propagates the classification to all instances of the component in the design drawing, based on the shape of the component. In some embodiments, the component associated with each classified shape may be classified based on the received classification. In some embodiments, the classification may be stored in a data structure associated with the drawings or may be applied to the drawings prior to translating the vector drawings back to a vector version of the drawings. In some embodiments, the components detected and classified in the design drawings can be mapped to portions in the rasterized drawings. In particular, a detected component in the rasterized drawings that results in classification may be stored in a data structure with the approximate position and boundary of the component placement in the drawings. The data structure may be populated with additional detected components in the drawings.

FIG. 5 depicts an example user interface for obtaining component classification, according to one or more embodiments, Specifically. FIG. 5 shows an example user interface 400 in which extracted shapes are presented for classification. The classification user interface 500 may include extracted shapes 502A, 502B, and 502C. Each extracted shape may be associated with data from the drawings. As an example, shape 502A is associated with the name "CP1" 504A in the drawings, which are found at the files listed at 508A. In addition, the classification user interface may include a number of occurrences 510A indicating how many times the shape is found in the set of drawings. Similarly, shape 502B is associated with the name "CP2" 504B in the drawings, which are found at the files listed at 508B. In addition, the classification user interface may include a number of occurrences 510B indicating how many times the shape is found in the set of drawings. Further, shape 502C is associated with the name "CAP_3" 504C in the drawings, which are found at the files listed at 508C. In addition, the classification user interface may include a number of occurrences 510C indicating how many times the shape is found in the set of drawings.

According to some embodiments, the classification user interface may provide a predicted classification for one or more of the shapes, based on the trained classification library. Accordingly, shape 502A and shape 502B have an initial classification as "CAP." as shown at 506A and 506B of the user interface 500. However, shape 502C does not include a predicted classification, and the user is prompted to provide a classification, as shown at 506C. In some embodiments, the trained classification library may be associated with a confidence threshold at which a predicted classification is provided. For example, the predicted classification of CAP for shapes 502A and 502B may be associated with a confidence value that satisfies a predetermined threshold, whereas no classification prediction for shape 502C satisfies a confidence threshold.

User input component 506C allows a user to enter or select a classification for object 502C. In addition, the user may confirm the predicted classifications for objects 502A and 502B. As such, items 506A and 506B may be editable fields in which a classification may be corrected. Upon confirming a new or predicted classification, the classification is propagated throughout the set of drawings at every instance of the shape. For example, shape 502A occurs 11 times throughout the drawings. Upon confirmation, the classification of "CAP" will be propagated to all 11 instances of the shape appearing in the drawings. Similarly, upon receiving a classification for shape 502C, the classification will be propagated to the 1 instance of the shape in the drawings.

Figure 6:
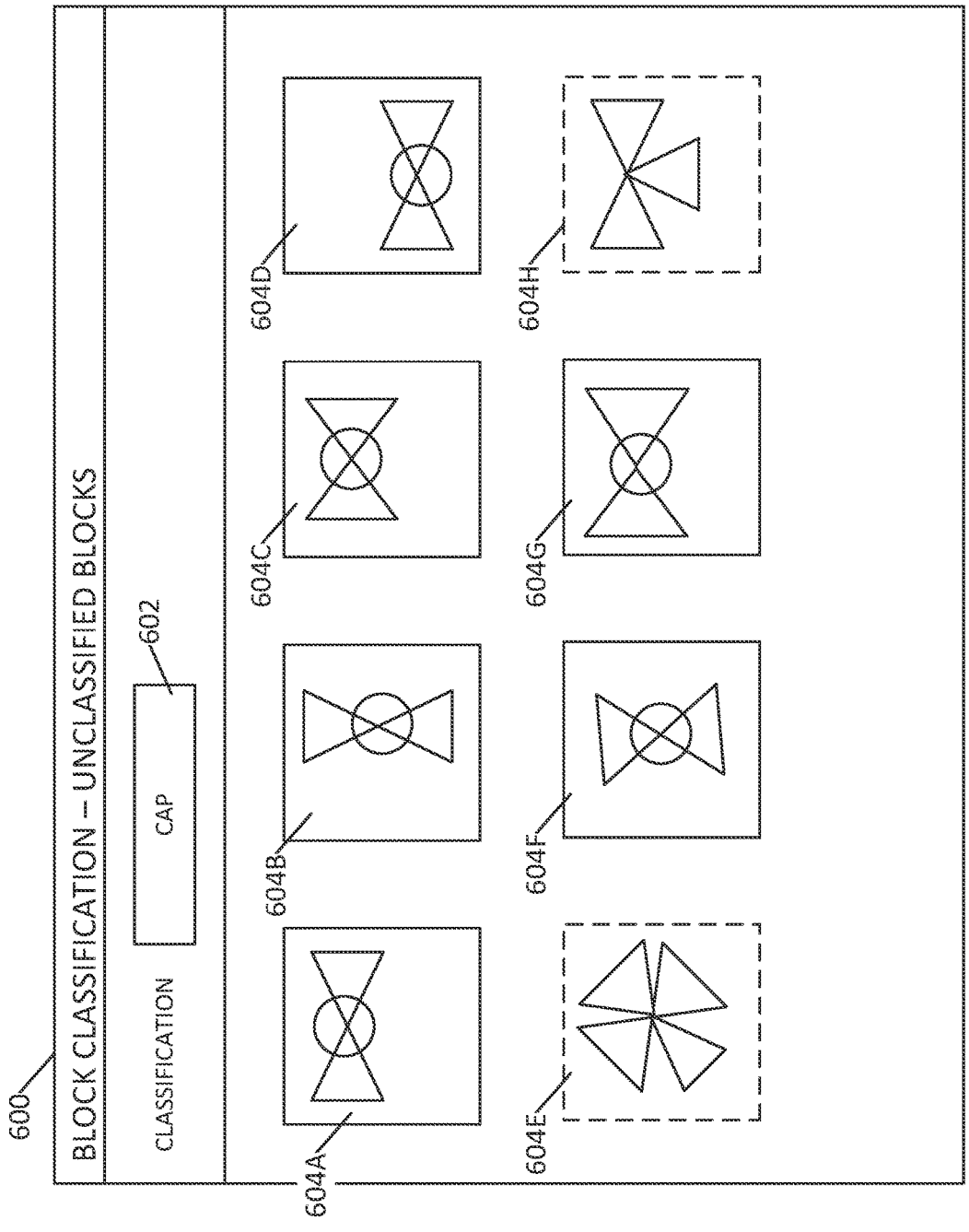
FIG. 6 depicts an alternate example user interface for obtaining component classification, according to one or more embodiments.

FIG. 6 depicts an alternate example user interface for obtaining component classification, according to one or more embodiments, Specifically. FIG. 6 provides a user interface 600 including a view of detected shapes in the form of an inventory of unclassified blocks. The classification user interface 600 may include extracted shapes 604A, 604B, 604C, 604D, 604E, 604F, 604G, and 604H. The shapes may be presented in accordance with a determination, based on object detection techniques, that they are substantially similar. For example, feature detection may be used to determine a similarity measure among the shapes. Shapes for which a similarity measure satisfies a predetermined threshold may be presented together in the user interface for classification by a user.

In some embodiments, the user interface 600 may include a user input component 602 by which a user may provide or confirm a classification for objects. In some embodiments, the classification may be provided to all objects in the view. Alternatively, in some embodiments, the classification user interface may present the shapes 604A-H as selectable components. A selection of a set of the shapes may be received via user input and assigned a classification according to user input entered or confirmed by user input component 602. As such, in the current example, shapes 604A, 604B, 604C, 604D, 604F, and 604G are selected for classification as a "CAP." Upon receiving or confirming the classification, the computer system can then propagate the classification of "CAP" across every instance of shapes 604A, 604B, 604C, 604D, 604F, and 604G throughout the drawings. In addition, shapes 604E and 604H remain unselected, indicating that shapes 604E and 604H remain unclassified.

Figure 7:
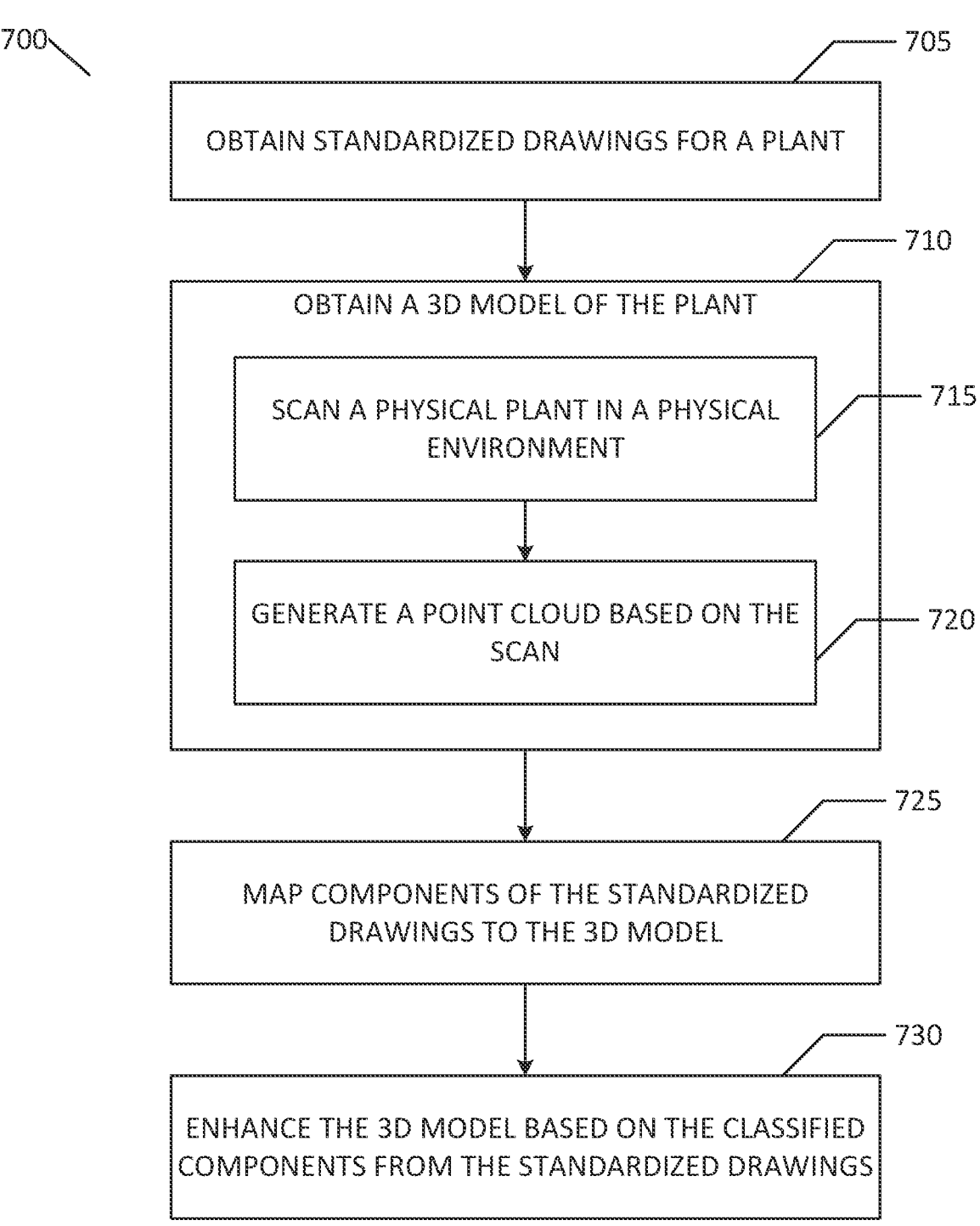
FIG. 7 shows a flowchart of a method for providing a 3D model of the subject of design drawings based on the classifications, according to one or more embodiments.

FIG. 7 shows a flowchart of a method for generating an enhanced 3D model, according to one or more embodiments. It should be understood that the particular flow of the flow diagram is used only to exemplify one embodiment. In other embodiments, any of the various components depicted in the flow diagram may be omitted, or the components may be performed in a different order or even concurrently. In addition, other embodiments may include additional steps not depicted as part of the flow diagram. Further, the various steps may be described as being performed by particular modules or components.

The flowchart 700 begins at block 705 where the system obtains standardized drawings for a plant. The drawings may be in vector form or rasterized form, for example. In some embodiments, the standardized drawings may be configured to include consistent representations of components throughout, for example through the process described above with respect to FIG. 1.

The flowchart continues at block 710 where the system obtains a 3D model of the physical plant corresponding to the drawings obtained at block 705. In some embodiments, the 3D model may be a model obtained from storage, such as local storage or network storage. In some embodiments, a 3D model may be generated. For example, at 715, some embodiments include scanning a physical plant in a physical environment. The physical plant may be scanned, for example, using a camera system which has depth determination capability, such as a depth camera, stereo camera, 3D scanner, or the like. In addition, the point cloud may be generated by photogrammetry software and the like. At block 720, a point cloud is generated based on the scan. A point cloud may include a set of points that represent one or more 3D shapes in a physical plant. That is, the point cloud includes a representation of points in space from which 3D shapes can be recognized. From the point cloud, a 3D model may be generated in a number of ways. For example, a modeling software may be used to generate, manually or automatically, 3D geometric representations of the content inside the point cloud (for example, the recognized 3D shapes). Said another way, whereas the point cloud provides a visual representation of a plant, the 3D model provides a data representation of the plant.

The flowchart continues at block 725 where the components of the standardized drawings are mapped to the 3D model. The mapping may be accomplished in a variety of ways. For example, a process line may be automatically traced in the 3D model and the standardized drawings to identify components in the 3D model based on the standardized components from the standardized drawings. The flowchart concludes at block 730 where the system enhances the 3D model based on the classified components of the standardized drawings identified in the 3D model. That is, based on the fact that the 3D model has a particular component and 3D representation also has the particular component, identity information (such as component attributes) from the 3D representation may be mapped to the 3D model. For example, an identifier may be used to tag a component in the 3D model from which attributes for the component may be provided.

Figure 8:
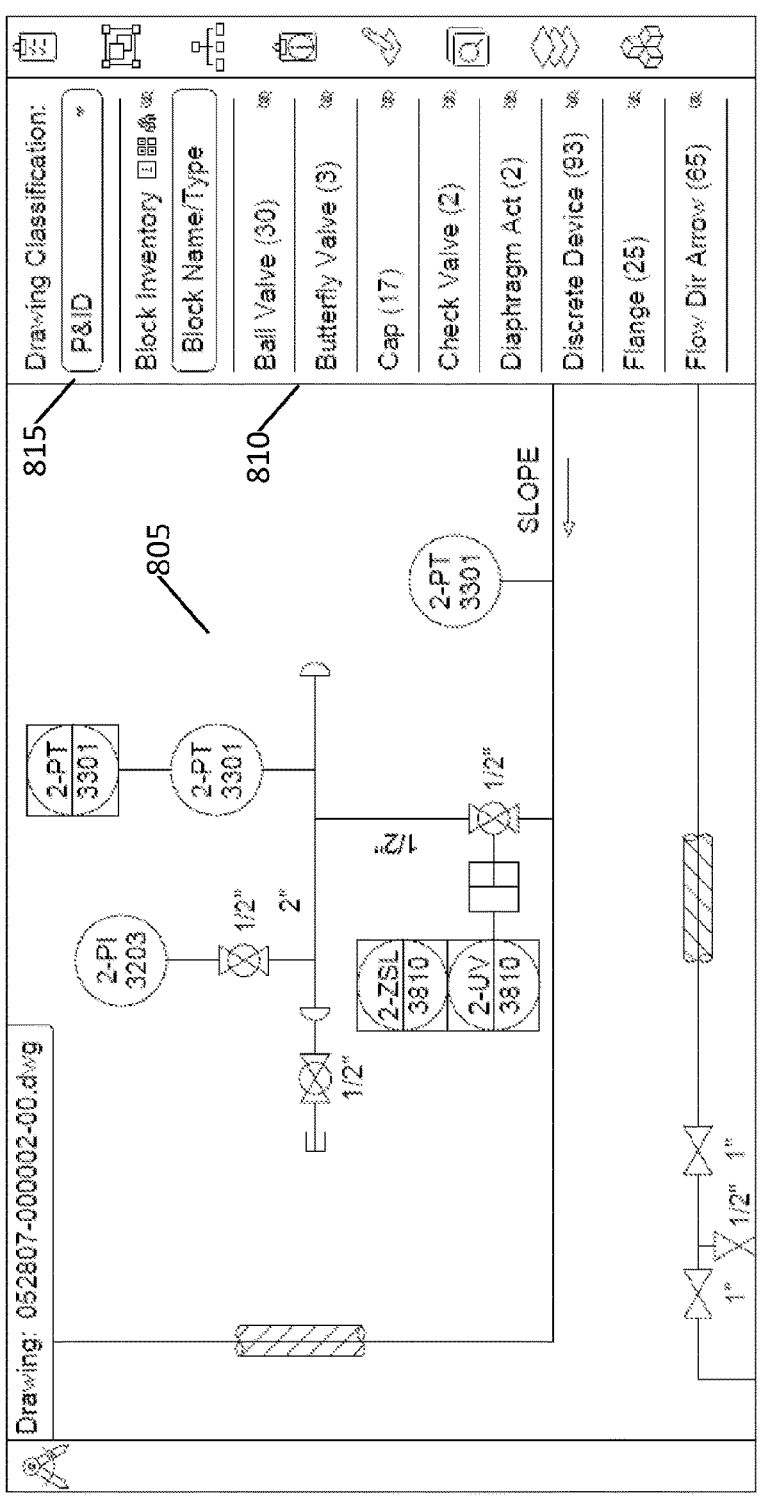
FIGS. 8-9 depict example user interfaces for viewing standardized drawings, according to one or more embodiments.

FIG. 8 depicts an example user interface for viewing standardized drawings, according to one or more embodiments, FIG. 8 shows an example user interface 800 in which a design drawing 805 is presented. The user interface 800 also includes a library of components in the form of a block inventory 810. In addition, the user interface 800 includes a user interface module 815 to change a drawing classification.

Figure 9:
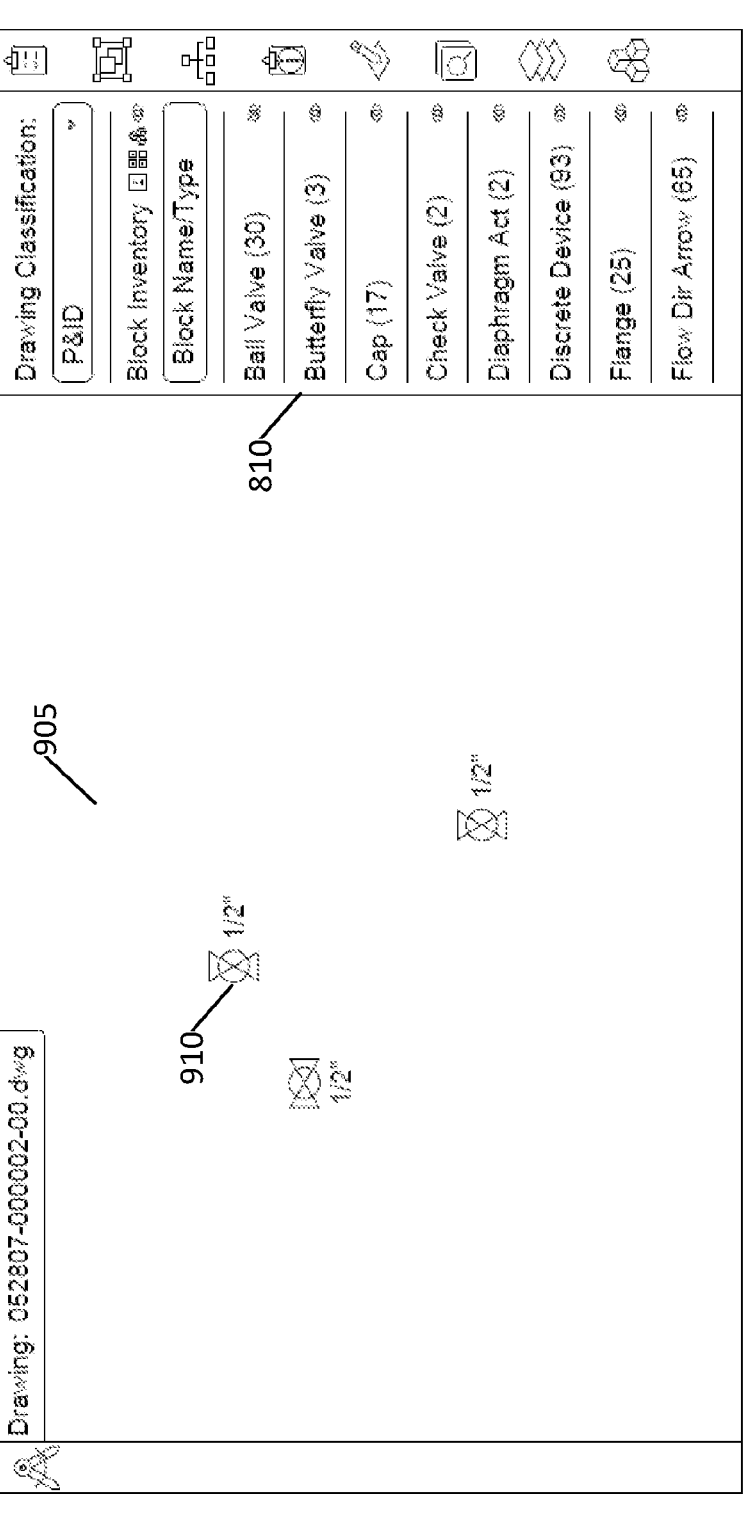

FIG. 9 depicts an example user interface 900 which depicts an example of user interface 800 in which a user has removed the all the categorized components in the drawing 905 in order to easily review uncategorized components in the drawing. From here, a user can easily select an uncategorized component, such as uncategorized component 910 by selecting the geometric shape. The user can then select a classification for uncategorized component 910, for example, from block inventory 810. As described above, in some embodiments, the user-defined classification may then be used to refine a model from which the components are automatically categorized.

Figure 10:
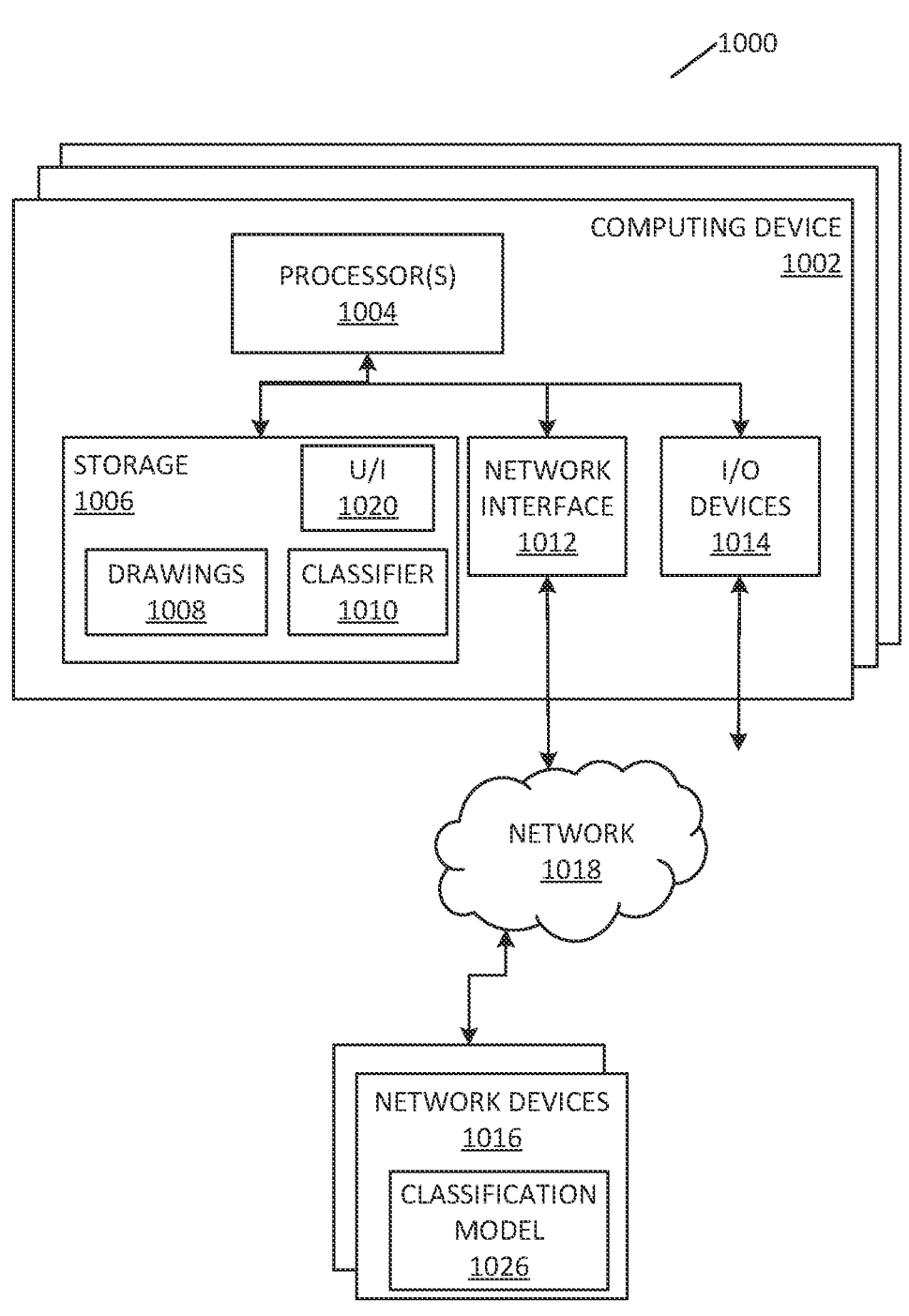
FIG. 10 shows an example of a hardware system for implementation of the improved classification techniques in accordance with the disclosed embodiments.

FIG. 10 shows an example of a hardware system for implementation of the improved classification techniques in accordance with the disclosed embodiments, FIG. 10 depicts a computing system 1000 including a client computing device 1002 connected to one or more network devices 1016 over a network 1018. Computing device 1002 may comprise a personal computer, a tablet device, a smart phone, network device, or any other electronic device which may be used to manage digital plant drawings and models. The network 1018 may comprise one or more wired or wireless networks, wide area networks, local area networks, short range networks, and the like. Users of the computing device 1002 can interact with the network devices 1016 to access services controlled and/or provided by the network devices 1016.

Computing device 1002 may include one or more processors 1004. Processor 1004 may include multiple processors of the same or different type and may be configured to execute computer code or computer instructions. Computing device 1002 may also include a storage 1006. Storage 1006 may each include one or more different types of memory, which may be used for performing functions in conjunction with processor 1004. For example, memory 1006 may include cache, ROM, RAM, or any kind of transitory or non-transitory computer readable storage medium capable of storing computer readable code. Storage 1006 may store various programming modules for execution by processor 1004, including a user interface 1020, drawings storage 1008, and a component classifier 1010. The user interface 1020 may provide an interface in which a user may view and interact with digital design drawings, as described above. The drawings store 1008 may be a local storage which includes digital drawings and/or 3D models of plants. Classifier 1010 may include a trained model by which components of the drawings may be classified in order to generate standardized drawings. In some embodiments, classifier may include an object detection module for extracting shapes from the drawings. Further, the classifier 1010 may include a trained classification library in the form of a machine learning network trained to predict a classification based on a given shape, for example, as provided by an object detection module. In some embodiments, the classifier 1010 may include a single network trained to perform object detection and predict a classification for a detected shape.

Computing device 1002 also includes a network interface 1012 and I/O devices 1014. The network interface 1012 may be configured to allow data to be exchanged between computing devices 1002 and/or other devices coupled to the network 1018. The network interface 1012 may support communication via wired or wireless data networks. Input/output devices 1014 may include one or more display devices, keyboards, keypads, touchpads, mice, scanning devices, voice or optical recognition devices, or any other devices suitable for entering or retrieving data by one or more computing devices 1002.

Network device 1016 may include similar components and functionality as those described in computing device 1002. Network device 1016 may include, for example, one or more servers, network storage devices, additional client devices, and the like. Specifically, network device may include a memory, storage, and one or more processors. In addition, network device 1016 may store an additional or alternative classification model 1026 to that used by computing device 1002. For example, computing device 1002 may store a device-specific model, whereas network device 1016 may store a global classification model. While the various components are presented in a particular configuration across the various systems, it should be understood that the various modules and components may be differently distributed across the network.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method for generating intelligent drawings, comprising:

obtaining a current set of design drawings for a physical plant comprising a plurality of components;

generating rasterized drawings from the current set of design drawings;

applying an object detection model to the rasterized drawings to extract a set of shapes corresponding to components in the current set of design drawings;

applying a trained library to the extracted shapes to obtain a classification of components in the current set of design drawings; and propagating the classification to instances of the components in the current set of design drawings by applying the classification to vector drawings corresponding to the current set of design drawings to obtain vector standardized drawings.

2. The method of claim 1, wherein the trained library is trained by:

providing a previous set of design drawings prior to the current set of design drawings;

generating prior rasterized drawings from the previous set of design drawings;

applying the object detection model to the rasterized drawings to extract a prior set of shapes corresponding to components in the previous set of design drawings;

providing a user interface comprising one or more of the prior set of shapes and a user input component to classify the one of more of the prior set of shapes; and receiving, via the user interface, a classification for the one or more prior set of shapes, wherein the trained library is trained based on the received classification for the one or more prior sets of shapes.

3. The method of claim 1, wherein applying a trained library to the extracted shapes to obtain a classification of components in the current set of design drawings comprises:

obtaining an initial classification for the extracted shapes; and presenting a prompt, in a user interface, to a user to confirm the initial classification for the extracted shapes, wherein the classification is propagated in accordance with a received confirmation of the initial classification.

4. The method of claim 3, further comprising:

receiving, in response to the prompt, a correction to the initial classification to obtain the classification; and retraining the trained library based on the correction.

5. The method of claim 1, wherein the current set of design drawings comprises inconsistent representations of components, and wherein the vector standardized drawings comprise standardized representations of the components.

6. The method of claim 1, wherein the current set of design drawings are obtained from a plurality of sources.

7. The method of claim 1, further comprising:

obtaining a 3D model of a system corresponding to the current set of design drawings;

applying a mapping process to identify the plurality of components from a 2D model against the 3D model; and enhancing the 3D model to include the classified components.

8. A non-transitory computer readable medium comprising computer readable code for generating intelligent drawings, the computer readable code executable by one or more processors to:

obtain a current set of design drawings for a physical plant comprising a plurality of components;

obtain rasterized drawings from the current set of design drawings;

apply a trained model to the rasterized drawings, wherein the trained model identifies and classifies components in the current set of design drawings based on a trained library;

update a data structure to include classified components based on the application of the trained model; and apply the data structure to vector drawings corresponding to the current set of design drawings to obtain vector standardized drawings.

9. The non-transitory computer readable medium of claim 8, wherein the trained library is trained by:

providing a previous set of drawings prior to the current set of drawings;

generating prior rasterized drawings from the previous set of drawings;

applying an object detection model to the rasterized drawings to extract a prior set of shapes corresponding to components in the drawings;

providing a user interface comprising one or more of the prior set of shapes and a user input component to classify the one of more of the prior set of shapes; and receiving, via the user interface, a classification for the one or more prior set of shapes, wherein the trained library is trained based on the received classification for the one or more prior sets of shapes.

10. The non-transitory computer readable medium of claim 8, wherein the computer readable code to update the data structure to include the classified components comprises computer readable code to:

obtain an initial classification for the components; and present a prompt, in a user interface, to a user to confirm the initial classification for the components, wherein the classification is propagated in accordance with a received confirmation of the initial classification.

11. The non-transitory computer readable medium of claim 10, further comprising computer readable code to:

receive, in response to the prompt, a correction to the initial classification to obtain the classification; and retrain the trained library based on the correction.

12. The non-transitory computer readable medium of claim 8, wherein propagating the classification comprises applying the classification to vector drawings corresponding to the current set of design drawings to obtain vector standardized drawings.

13. The non-transitory computer readable medium of claim 12, wherein the current set of design drawings comprises inconsistent representations of components, and wherein the vector standardized drawings comprise standardized representations of the components.

14. The non-transitory computer readable medium of claim 12, wherein the current set of design drawings are obtained from a plurality of sources.

15. The non-transitory computer readable medium of claim 8, further comprising computer readable code to:

obtain a 3D model of a system corresponding to the current set of design drawings;

apply a mapping process to identify the plurality of components from a 2D model against the 3D model; and enhance the 3D model to include the classified components.

16. A system for generating intelligent drawings, comprising:

one or more processors; and one or more computer readable media comprising computer readable code executable by the one or more processors to:

obtain a current set of design drawings for a physical plant comprising a plurality of components;

obtain rasterized drawings from the current set of design drawings;

apply a trained model to the rasterized drawings, wherein the trained model identifies and classifies components in the current set of design drawings based on a trained library;

update a data structure to include classified components based on the application of the trained model; and apply the data structure to vector drawings corresponding to the current set of design drawings to obtain vector standardized drawings.

17. The system of claim 16, wherein the trained library is trained by:

providing a previous set of design drawings prior to the current set of design drawings;

generating prior rasterized drawings from the previous set of design drawings;

applying an object detection model to the rasterized drawings to extract a prior set of shapes corresponding to components in the previous set of design drawings;

providing a user interface comprising one or more of the prior set of shapes and a user input component to classify the one of more of the prior set of shapes; and receiving, via the user interface, a classification for the one or more prior set of shapes, wherein the trained library is trained based on the received classification for the one or more prior sets of shapes.

18. The system of claim 16, wherein the computer readable code to update the data structure to include the classified components comprises computer readable code to:

obtain an initial classification for the components; and present a prompt, in a user interface, to a user to confirm the initial classification for the components, wherein the classification is propagated in accordance with a received confirmation of the initial classification.

19. The system of claim 18, further comprising computer readable code to:

receive, in response to the prompt, a correction to the initial classification to obtain the classification; and retrain the trained library based on the correction.

\* \* \* \* \*